US012696660B2

(12) United States Patent
Cho et al.

(10) Patent No.: US 12,696,660 B2
(45) Date of Patent: Jul. 28, 2026

(54) DISPLAY DEVICE

(71) Applicant: LG DISPLAY CO., LTD., Seoul (KR)

(72) Inventors: WooChan Cho, Paju si (KR); ChulHo Kim, Seo gu (KR); JungSik Jo, Goyang si (KR); Kyu-Hwang Lee, Paju si (KR); Hyunjin Kim, Goyang si (KR)

(73) Assignee: LG DISPLAY CO., LTD., Seoul (KR)

( * ) Notice: Subject to any disclaimer, the term of this patent is extended or adjusted under 35 U.S.C. 154(b) by 325 days.

(21) Appl. No.: 18/451,245

(22) Filed: Aug. 17, 2023

(65) Prior Publication Data

US 2024/0215388 A1     Jun. 27, 2024

(30) Foreign Application Priority Data

Dec. 22, 2022     (KR) ........................ 10-2022-0181405

(51) Int. Cl.
H10K 59/80       (2023.01)
H10K 59/123     (2023.01)
H10K 59/131     (2023.01)

(52) U.S. Cl.
CPC ....... H10K 59/8722 (2023.02); H10K 59/873 (2023.02); *H10K 59/123* (2023.02); *H10K 59/131* (2023.02)

(58) Field of Classification Search
CPC .... H10K 59/65; H10K 59/88; H10K 59/8722; H10K 59/873
See application file for complete search history.

(56) References Cited

U.S. PATENT DOCUMENTS

| | | | | |
|---|---|---|---|---|
| 2020/0168683 A1* | 5/2020 | Son | ........................ | H10K 77/10 |
| 2021/0066419 A1 | 3/2021 | Byun et al. | | |
| 2021/0408477 A1* | 12/2021 | Park | .................... | H10K 59/131 |
| 2022/0052134 A1 | 2/2022 | Zhang et al. | | |

FOREIGN PATENT DOCUMENTS

| | | | | |
|---|---|---|---|---|
| CN | 110634928 A | | 12/2019 | |
| CN | 111816118 A | * | 10/2020 | ........... H10K 59/873 |
| CN | 112186012 A | * | 1/2021 | ........ H10K 59/8731 |
| KR | 10-2021-0055954 A | | 5/2021 | |
| WO | WO-2021203329 A1 | * | 10/2021 | ............. H10K 59/88 |

* cited by examiner

*Primary Examiner* — Mariceli Santiago
(74) *Attorney, Agent, or Firm* — PnK IP LLC

(57)     ABSTRACT

A display device includes a substrate including an active area, a hole area disposed within the active area and having a through hole disposed therein, and a disconnection area surrounding the hole area; and a plurality of disconnection structures disposed on the substrate in the disconnection area, wherein each of the plurality of disconnection structures includes, a lower layer, an intermediate layer disposed on the lower layer and having a width smaller than that of the lower layer, and an upper layer disposed on the intermediate layer and having a width greater than that of the intermediate layer, thereby penetration of moisture or oxygen from the through hole into the active area is minimized.

13 Claims, 11 Drawing Sheets

DISPLAY DEVICE

CROSS-REFERENCE TO RELATED APPLICATION

This application claims the priority of Korean Patent Application No. 10-2022-0181405 filed on Dec. 22, 2022, which is hereby incorporated by reference in its entirety.

BACKGROUND

Field of the Disclosure

The present disclosure relates to a display device, and more particularly, to a display device in which an electronic component is embedded within an active area.

Description of the Background

Display devices used in computer monitors, TVs, and mobile phones include organic light emitting displays (OLEDs) that emit light by themselves, and liquid crystal displays (LCDs) that require a separate light source.

Display devices are being applied to more and more various fields of applications including not only computer monitors and TVs, but also personal mobile devices, and thus, display devices having a reduced volume and weight while having a wide active area are being studied.

In addition, display devices are provided with electronic components such as cameras and proximity sensors to provide more various functions to users. However, since electronic components such as cameras and sensors are disposed in a non-active area of the display device, it is difficult to reduce a bezel of the display device. Accordingly, recently, display devices in which a hole is formed within an active area for displaying an image and an electronic component is embedded in the active area have been developed.

SUMMARY

Accordingly, the present disclosure is directed to a display device that substantially obviates one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide a display device having a through hole in which an electronic component is disposed within an active area.

The present disclosure is also to provide a display device that minimizes penetration of moisture or oxygen from a through hole into the active area.

The present disclosure is also to provide a display device having disconnection structures for disconnecting a penetration path of moisture or oxygen between a through hole and an active area.

Further, the present disclosure is to provide a display device having improved reliability by disconnecting a common layer that is commonly formed across an active area and a disconnection area in the disconnection area.

The present disclosure is not limited to the above-mentioned features, and other features, which are not mentioned above, may be clearly understood by those skilled in the art from the following descriptions.

To achieve these and other advantages and in accordance with the present disclosure, as embodied and broadly described, a display device includes a substrate including an active area, a hole area disposed within the active area and having a through hole disposed therein, and a disconnection area surrounding the hole area; and a plurality of disconnection structures disposed on the substrate in the disconnection area, wherein each of the plurality of disconnection structures includes, a lower layer, an intermediate layer disposed on the lower layer and having a width smaller than that of the lower layer, and an upper layer disposed on the intermediate layer and having a width greater than that of the intermediate layer.

Other detailed matters of the exemplary aspects are included in the detailed description and the drawings.

According to the present disclosure, a bezel of a display device may be minimized by forming a through hole in which an electronic component is embedded within an active area.

According to the present disclosure, penetration of moisture or oxygen in a through hole into an active area may be minimized.

According to the present disclosure, reliability of a display device may be improved by protecting a light emitting element from moisture or oxygen.

According to the present disclosure, a penetration path of moisture and oxygen may be blocked by disconnecting a common layer that is formed in an active area and a disconnection area in the disconnection area.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
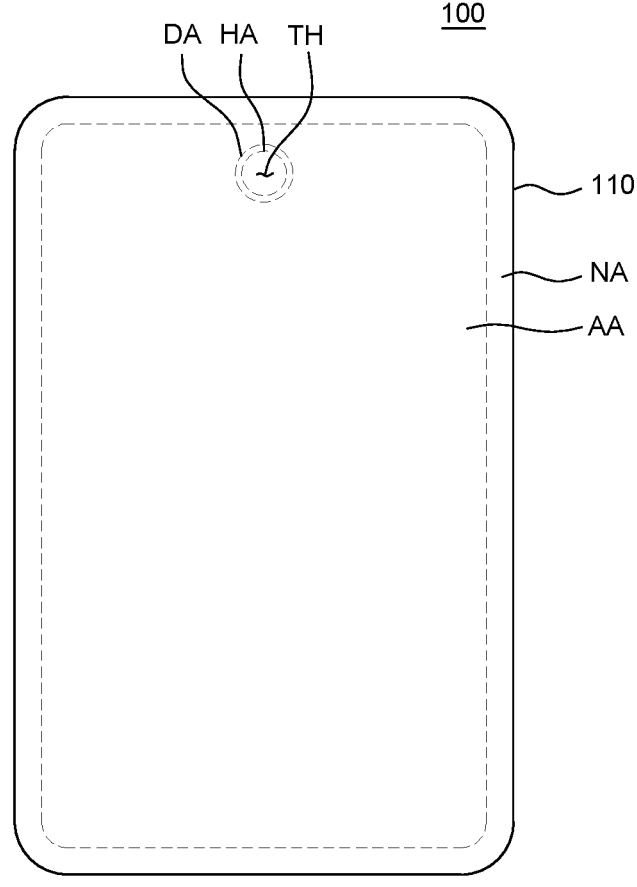
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

Figure 2:
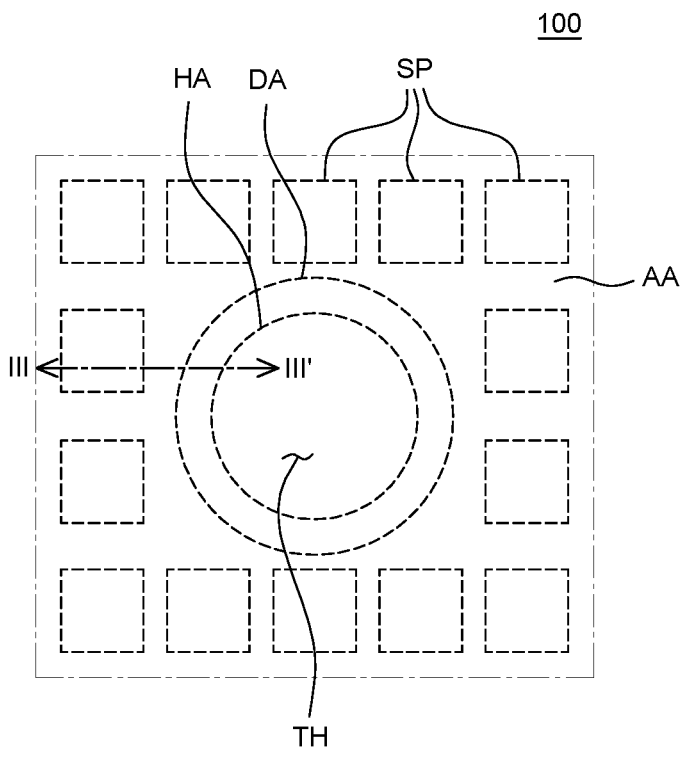
FIG. 2 is an enlarged plan view of the display device according to an exemplary aspect of the present disclosure.

FIG. 1 is a plan view of a display device according to an exemplary aspect of the present disclosure. FIG. 2 is an enlarged plan view of the display device according to an exemplary aspect of the present disclosure. In FIG. 1, only a substrate 110 among various components of a display device 100 is illustrated for convenience of description.

Referring to FIGS. 1 and 2, the substrate 110 includes an active area AA, a hole area HA, a disconnection area DA, and a non-active area NA.

The active area AA is an area where a plurality of sub-pixels SP are disposed to display an image. Each of the plurality of sub-pixels SP is an individual unit emitting light, and a light emitting element 130 and a driving circuit are formed in each of the plurality of sub-pixels SP. For example, display elements for displaying an image and circuit units for driving the display elements may be disposed in the plurality of sub-pixels SP. For example, when the display device 100 is an organic light emitting display device, the display element may include an organic light emitting element 130, and when the display device 100 is a liquid crystal display device, the display element may include a liquid crystal element. The plurality of sub-pixels SP may include a red sub-pixel, a green sub-pixel, a blue sub-pixel, and/or a white sub-pixel, but are not limited thereto.

The non-active area NA is an area where an image is not displayed, and various lines, driver ICs and the like for driving the plurality of sub-pixels SP disposed in the active area AA are disposed in the non-active area NA. For example, various ICs such as a gate driver IC and a data driver IC and driving circuits may be disposed in the non-active area NA. The non-active area NA in which an image is not displayed may also be defined as a bezel area.

Meanwhile, the non-active area NA may be defined as an area surrounding the active area AA as illustrated in FIG. 1. However, the non-active area NA may be defined as an area extending from the active area AA or may be defined as an area where the plurality of sub-pixels SP are not disposed, but the present disclosure is not limited thereto.

The hole area HA is disposed within the active area AA. The hole area HA is disposed between the plurality of sub-pixels SP in the active area AA. The hole area HA is an area where electronic components such as a camera, a light source, a speaker, and a fingerprint sensor are disposed. The hole area HA includes a through hole TH that penetrates some components of the display device 100 to dispose the electronic components. The through hole TH that penetrates the substrate 110 may be formed to secure a space in which the electronic component is disposed. In the drawings, the hole area HA is illustrated as having a circular shape, but this is exemplarily provided and the shape of the hole area HA may be variously modified.

The disconnection area DA is disposed between the active area AA and the hole area HA. The disconnection area DA is disposed to surround the hole area HA. A plurality of dam portions and a plurality of disconnection structures 150 may be disposed in the disconnection area DA to minimize penetration of moisture or oxygen into the active area AA through the through hole TH.

Hereinafter, the active area AA, the disconnection area DA, and the hole area HA will be described in more detail with reference to FIG. 3.

Figure 3:
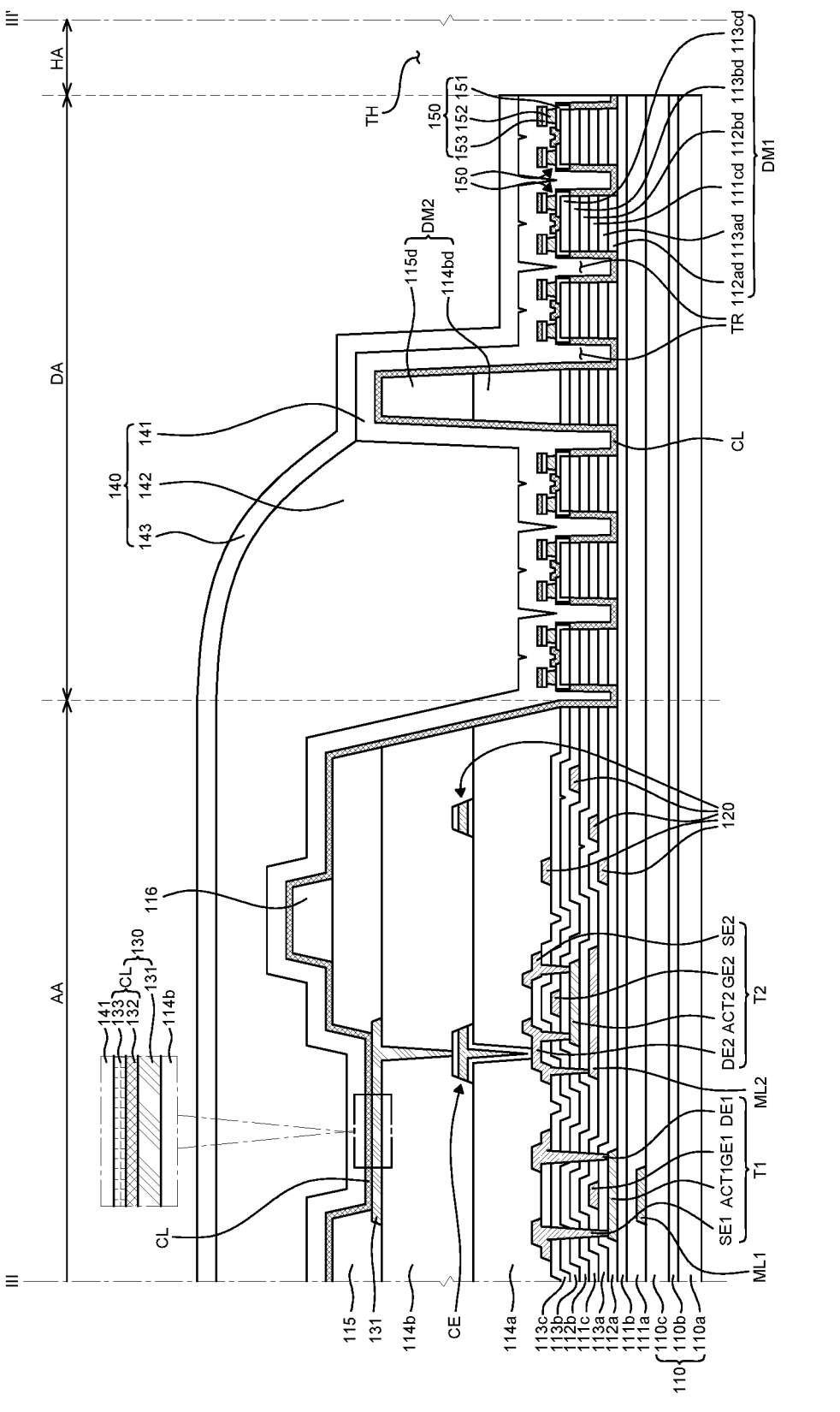
FIG. 3 is a cross-sectional view taken along III-III' of FIG. 2.
Figure 4:
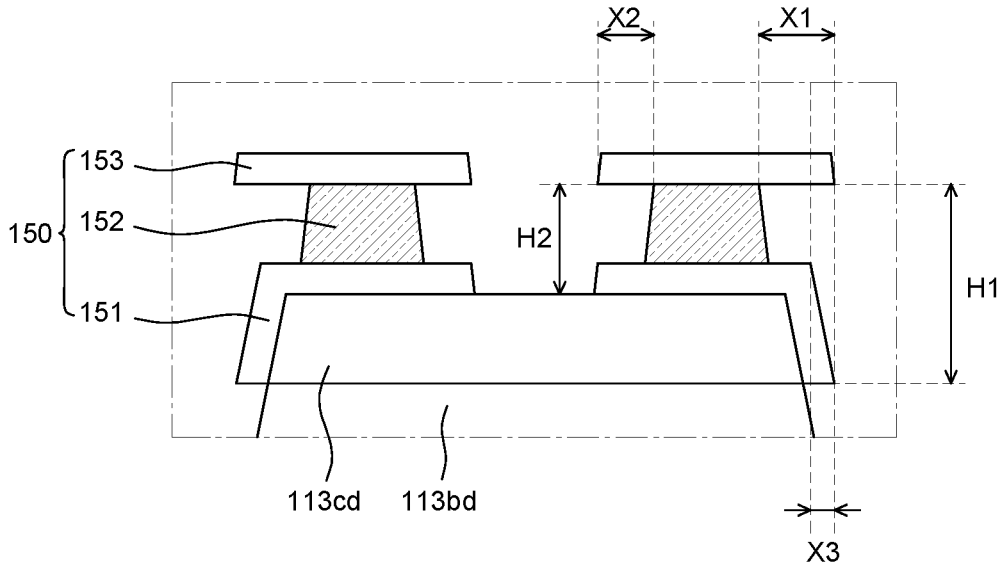
FIG. 4 is an enlarged cross-sectional view of disconnection structures of the display device according to an exemplary aspect of the present disclosure.

FIG. 3 is a cross-sectional view taken along III-III' of FIG. 2. FIG. 4 is an enlarged cross-sectional view of disconnection structures of the display device according to an exemplary aspect of the present disclosure. In FIG. 4, for convenience of description, only the disconnection structures 150 and a portion of a first dam portion DM1 under the disconnection structures 150 are illustrated. Referring to FIG. 3, the display device 100 according to an exemplary aspect of the present disclosure includes the substrate 110, a first transistor T1, a second transistor T2, a first metal layer ML1, a second metal layer ML2, a plurality of signal lines 120, the light emitting element 130, an encapsulation layer 140, first dam portions DM1, second dam portions DM2, the disconnection structures 150, and a plurality of insulating layers. The plurality of insulating layers may include a first buffer layer 111a, a second buffer layer 111b, a first gate insulating layer 112a, a first interlayer insulating layer 113a, a third buffer layer 111c, a second gate insulating layer 112b, a second interlayer insulating layer 113b, a third interlayer insulating layer 113c, a first planarization layer 114a, a second planarization layer 114a and the like.

Referring to FIG. 3, the substrate 110 is a support member for supporting other components of the display device 100 and may be formed of an insulating material. For example, the substrate 110 may be formed of glass or resin. In addition, the substrate 110 may be formed to include a polymer or plastic such as polyimide (PI), or may be formed of a material having flexibility.

Also, the substrate 110 may have a multilayer structure. For example, the substrate 110 may have a multilayer structure of a first substrate layer 110a, a substrate insulating layer 110b on the first substrate layer 110a, and a second substrate layer 110c on the substrate insulating layer 110b. The first substrate layer 110a and the second substrate layer 110c may be formed of the same material, for example, a plastic material. In addition, the substrate insulating layer 110b may be formed of a single layer or multiple layers of silicon oxide (SiOx) or silicon nitride (SiNx), but is not limited thereto. The substrate insulating layer 110b may be formed between the first substrate layer 110a and the second substrate layer 110c to block introduction of electric charges from the first substrate layer 110a into the display device 100 and block moisture or oxygen.

A first buffer layer 111a is disposed on the substrate 110 in the active area AA and the disconnection area DA. The first buffer layer 111a may prevent penetration of moisture or impurities through the substrate 110. The first buffer layer 111a may be formed of, for example, a single layer or multilayers of silicon oxide (SiOx) or silicon nitride (SiNx), but is not limited thereto.

The first metal layer ML1 is disposed on the first buffer layer 111a. The first metal layer ML1 may block light that is incident from a lower portion of the substrate 110 to a first active layer ACT1 of the first transistor T1. The light that is incident from the first metal layer ML1 to the first active layer ACT1 of the first transistor T1 may be blocked, thereby minimizing leakage current. Accordingly, the first metal layer ML1 may function as a light blocking layer. Also, the first metal layer ML1 may form a capacitor with other components on the substrate 110, but the present disclosure is not limited thereto.

A second buffer layer 111b is disposed on the first metal layer ML1 and the first buffer layer 111a in the active area AA and the disconnection area DA. The second buffer layer 111b may reduce penetration of moisture or impurities through the substrate 110. The second buffer layer 111b may be formed of, for example, a single layer or multilayers of silicon oxide (SiOx) or silicon nitride (SiNx), but is not limited thereto. However, the second buffer layer 111b may be omitted depending on a type of the substrate 110 or types of transistors, but is not limited thereto.

The first transistor T1 is disposed on the second buffer layer 111b. The first transistor T1 includes the first active layer ACT1, a first gate electrode GE1, a first source electrode SE1, and a first drain electrode DE1.

The first active layer ACT1 is disposed on the second buffer layer 111b. The first active layer ACT1 may be formed of a semiconductor material such as an oxide semiconductor, amorphous silicon, or polysilicon, but is not limited thereto.

A first gate insulating layer 112a is disposed on the first active layer ACT1. The first gate insulating layer 112a is an insulating layer for insulating the first active layer ACT1 and the first gate electrode GE1, and may be formed of a single layer or multiple layers of silicon oxide (SiOx) or silicon nitride (SiNx), but the present disclosure is not limited thereto.

The first gate electrode GE1 is disposed on the first gate insulating layer 112a. The first gate electrode GE1 may be formed of a conductive material such as copper (Cu), aluminum (Al), molybdenum (Mo), nickel (Ni), titanium (Ti), and chromium (Cr), or an alloy thereof, but is not limited thereto.

A first interlayer insulating layer 113a is disposed on the first gate electrode GE1. The first interlayer insulating layer 113a is an insulating layer for protecting components under the first interlayer insulating layer 113a, and may be formed of a single layer or multiple layers of silicon oxide (SiOx) or silicon nitride (SiNx), but the present disclosure is not limited thereto.

A third buffer layer 111c is disposed on the first interlayer insulating layer 113a. The third buffer layer 111c may reduce penetration of moisture or impurities through the substrate 110. The third buffer layer 111c may be formed of, for example, a single layer or multilayers of silicon oxide (SiOx) or silicon nitride (SiNx), but is not limited thereto.

A second gate insulating layer 112b is disposed on the third buffer layer 111c. The second gate insulating layer 112b is an insulating layer for insulating a second active layer ACT2 and a second gate electrode GE2, to be described later, and may be formed of a single layer or multiple layers of silicon oxide (SiOx) or silicon nitride (SiNx). However, the present disclosure is not limited thereto.

A second interlayer insulating layer 113b and a third interlayer insulating layer 113c are disposed on the second gate insulating layer 112b. The second interlayer insulating layer 113b and the third interlayer insulating layer 113c are insulating layers for protecting components under the second interlayer insulating layer 113b and the third interlayer insulating layer 113c, and may be formed of a single layer or multiple layers of silicon oxide (SiOx) or silicon nitride (SiNx). However, the present disclosure is not limited thereto.

The first source electrode SE1 and the first drain electrode DE1 are disposed on the third interlayer insulating layer 113c. Each of the first source electrode SE1 and the first drain electrode DE1 may be electrically connected to the first active layer ACT1 through contact holes of the third interlayer insulating layer 113c, the second interlayer insulating layer 113b, the second gate insulating layer 112b, the third buffer layer 111c, the first interlayer insulating layer 113a, and the first gate insulating layer 112a. The first source electrode SE1 and the first drain electrode DE1 may be formed of a conductive material, for example, copper (Cu), aluminum (Al), molybdenum (Mo), nickel (Ni), titanium (Ti), chromium (Cr) or an alloy thereof, but the present disclosure is not limited thereto.

The second metal layer ML2 is disposed between the first interlayer insulating layer 113a and the third buffer layer 111c. The second metal layer ML2 may block light that is incident from the substrate 110 into the second active layer ACT2 of the second transistor T2, or may form a capacitor with other components on the substrate 110.

Next, the second transistor T2 is disposed on the first interlayer insulating layer 113a. The second transistor T2 includes the second active layer ACT2, the second gate electrode GE2, a second source electrode SE2, and a second drain electrode DE2.

The second active layer ACT2 is disposed on the first interlayer insulating layer 113a. The second active layer ACT2 may be formed of a semiconductor material such as a second oxide semiconductor, amorphous silicon, or polysilicon, but is not limited thereto.

The second gate insulating layer 112b is disposed on the second active layer ACT2, and the second gate electrode GE2 is disposed on the second gate insulating layer 112b.

The second gate electrode GE2 may be formed of a conductive material such as copper (Cu), aluminum (Al), molybdenum (Mo), nickel (Ni), titanium (Ti), chromium (Cr), or an alloy thereof, but is not limited thereto.

The second interlayer insulating layer 113b and the third interlayer insulating layer 113c are disposed on the second gate electrode GE2, and the second source electrode SE2 and the second drain electrode DE2 are disposed on the third interlayer insulating layer 113c. Each of the second source electrode SE2 and the second drain electrode DE2 may be electrically connected to the second active layer ACT2 through contact holes of the third interlayer insulating layer 113c, the second interlayer insulating layer 113b, and the second gate insulating layer 112b. The second source electrode SE2 and the second drain electrode DE2 may be formed of a conductive material, for example, copper (Cu), aluminum (Al), molybdenum (Mo), nickel (Ni), titanium (Ti), chromium (Cr) or an alloy thereof, but the present disclosure is not limited thereto.

The second transistor T2 may be a driving transistor that controls driving current supplied to the light emitting element 130. The first transistor T1 may be any one of a switching transistor that transmits a data voltage to the second transistor T2 or a sensing transistor that senses characteristics of the second transistor T2.

A first planarization layer 114a is disposed on the first transistor T1 and the second transistor T2. The first planarization layer 114a may planarize upper portions of the first transistor T1 and the second transistor T2. The first planarization layer 114a may be formed of a single layer or multiple layers, and may be formed of, for example, photoresist or an acryl-based organic material, but the present disclosure is not limited thereto.

A connection electrode CE is disposed in the first planarization layer 114a. The connection electrode CE is an electrode that connects the second transistor T2 and the light emitting element 130. The connection electrode CE may have a multilayer structure. For example, the connection electrode CE may have a triple layer structure of titanium (Ti), aluminum (Al), and titanium (Ti). The disconnection structures 150 to be described later may be formed of the same material as the connection electrode CE, and a more detailed description thereof will be provided later with reference to FIGS. 5A to 5F.

A second planarization layer 114b is disposed on the connection electrode CE. The second planarization layer 114b may be formed of a single layer or multilayers, and may be formed of, for example, photoresist or an acryl-based organic material, but the present disclosure is not limited thereto.

Meanwhile, the plurality of signal lines 120 may be disposed in the active area AA adjacent to the disconnection area DA. The plurality of signal lines 120 may include scan lines, data lines, power lines, and the like. The plurality of respective signal lines 120 may be formed together with other components of the display device 100 when the other components of the display device 100 are formed. For example, the plurality of signal lines 120 may be formed of the same material on the same layer as the first gate electrode GE1, the second metal layer ML2, the second gate electrode GE2, the first source electrode SE1 and the first drain electrode DE1, the connection electrode CE, and the like.

The light emitting element 130 is disposed on the second planarization layer 114b. The light emitting element 130 is a self-emitting element 130 that emits light by driving current, and includes an anode 131, a light emitting layer 132, and a cathode 133.

The anode 131 is disposed on the second planarization layer 114b in each of the plurality of sub-pixels SP. The anode 131 may be connected to the connection electrode CE through a contact hole of the second planarization layer 114b, and the connection electrode CE may electrically connect the second drain electrode DE2 of the second transistor T2 and the anode 131. The anode 131 may supply holes to the light emitting layer 132 and may be formed of a conductive material having a high work function. For example, the anode 131 may be formed of tin oxide (TO), indium tin oxide (ITO), indium zinc oxide (IZO), indium tin zinc oxide (ITZO) or the like, but is not limited thereto.

If the display device 100 is in a top emission method in which light emitted from the light emitting element 130 travels upwardly of the light emitting element 130, a reflective layer may be further formed under the anode 131 so that the light emitted from the light emitting element 130 travels upwardly of the light emitting element 130.

A bank 115 is disposed on the anode 131. The bank 115 is disposed to cover an edge of the anode 131. The bank 115 may be disposed at a boundary between the sub-pixels SP adjacent to each other to reduce color mixing of light emitted from the light emitting element 130 of each of the plurality of sub-pixels SP. The bank 115 may be formed of an insulating material, for example, the bank 115 may be formed of polyimide, acryl, or benzocyclobutene (BCB)-based resin, but the present disclosure is not limited thereto.

The light emitting layer 132 is disposed on the anode 131 that is exposed from the bank 115 and the bank 115 in each of the plurality of sub-pixels SP. The light emitting layer 132 may emit light by receiving holes from the anode 131 and receiving electrons from the cathode 133. The light emitting layer 132 may be commonly disposed throughout an entirety of the plurality of sub-pixels SP.

The cathode 133 is disposed on the light emitting layer 132 and the bank 115. The cathode 133 may supply electrons to the light emitting layer 132 and may be formed of a conductive material having a low work function. For example, the cathode 133 may be formed of one or more materials selected from the group consisting of metals such as magnesium (Mg), silver (Ag), and aluminum (Al) and alloys thereof, but is not limited thereto.

Meanwhile, the light emitting layer 132 and the cathode 133 disposed in each of the plurality of sub-pixels SP may be connected to each other. One light emitting layer 132 and one cathode 133 may be disposed in all of the plurality of sub-pixels SP. That is, the plurality of sub-pixels SP may share the light emitting layer 132 and the cathode 133. Accordingly, the light emitting layer 132 and the cathode 133 may also be defined as a common layer CL.

A spacer 116 is disposed between the bank 115 and the common layer CL. The spacer 116 is disposed between the bank 115 and the light emitting layer 132. The spacer 116 may support a fine metal mask (FMM), which is a deposition mask used when forming the light emitting layer 132. By the spacer 116 supporting the deposition mask, a predetermined distance between the deposition mask and the bank 115 and a predetermined distance between the deposition mask and the anode 131 may be maintained, and damage due to contact of the deposition mask may be prevented. In this case, the spacer 116 may be formed in a shape in which a width thereof is reduced upwardly to minimize an area in contact with the deposition mask. The spacer 116 may be formed of an organic insulating material such as polyimide, acryl, or benzocyclobutene (BCB)-based resin, but is not limited thereto.

The encapsulation layer 140 is disposed on the light emitting element 130. The encapsulation layer 140 may be formed on the active area AA and the disconnection area DA. The encapsulation layer 140 may seal the light emitting element 130 and protect the light emitting element 130 from external moisture, oxygen, impacts, and the like. The encapsulation layer 140 may be formed in various structures according to design.

The encapsulation layer 140 may have a multilayer structure in which an inorganic layer formed of an inorganic insulating material and an organic layer formed of an organic material are alternately stacked. For example, the encapsulation layer 140 may be a triple layer including a first encapsulation layer 141 that is an inorganic layer, a second encapsulation layer 142 that is an organic layer, and a third encapsulation layer 143 that is an inorganic layer.

The first encapsulation layer 141 seals the active area AA and the disconnection area DA and protects the light emitting element 130 from oxygen and moisture penetrating into the active area AA. The first encapsulation layer 141 may be formed of an inorganic material, for example, may be formed of an inorganic material such as silicon nitride (SiNx), silicon oxide (SiOx), and aluminum oxide (AlOx), but the present disclosure is not limited thereto.

The second encapsulation layer 142 is disposed on the first encapsulation layer 141. The second encapsulation layer 142 is a layer for flattening an upper portion of the first encapsulation layer 141, fills cracks that may occur in the first encapsulation layer 141. When a foreign material is disposed on the first encapsulation layer 141, the second encapsulation layer 142 flattens an upper portion of the foreign material. The second encapsulation layer 142 may be formed of an organic material, and for example, an epoxy-based or acrylic-based polymer may be used for the second encapsulation layer 142, but the present disclosure is not limited thereto.

The third encapsulation layer 143 is disposed on the second encapsulation layer 142. The third encapsulation layer 143 may seal the active area AA and the disconnection area DA together with the first encapsulation layer 141. The third encapsulation layer 143 may be formed of an inorganic material such as silicon nitride (SiNx), silicon oxide (SiOx), or aluminum oxide (AlOx) like the first encapsulation layer 141, but the third encapsulation layer 143 is not limited thereto.

Meanwhile, the common layer CL of the light emitting elements 130 formed in the entirety of the sub-pixels SP may also be formed in the disconnection area DA. In this case, moisture or oxygen may penetrate into the active area AA through the common layer CL from the through hole TH adjacent to the disconnection area DA. Accordingly, the plurality of disconnection structures 150 for disconnecting the common layer CL may be formed in the disconnection area DA adjacent to the through hole TH to block a permeation path of moisture and oxygen.

First, referring to FIG. 3, the first buffer layer 111a and the second buffer layer 111b are disposed on the substrate 110 in the disconnection area DA, and a plurality of the first dam portions DM1 are formed on the second buffer layer 111b. In addition, the second dam portions DM1 are disposed on some first dam portions DM1 among the plurality of first dam portions DM1. The plurality of first dam portions DM1 and a plurality of the second dam portions DM2 may be formed in a shape of closed curves surrounding the hole area HA to block permeation of oxygen or moisture into the active area AA from the through hole TH. Also, the plurality of first dam portions DM1 and the plurality of second dam portions DM2 may prevent the second encapsulation layer 142 of the encapsulation layer 140 from overflowing toward the through hole TH. The plurality of first dam portions DM1 are spaced apart from each other and may form trenches TR. The trenches TR may be disposed between the plurality of first dam portions DM1.

The plurality of first dam portions DM1 may be formed by patterning at least portions of the plurality of insulating layers formed in the active area AA to form the trenches TR. For example, each of the plurality of first dam portions DM1 may include a first layer 112ad formed by patterning the first gate insulating layer 112a, a second layer 113ad formed by patterning the first interlayer insulating layer 113a, a third layer 111cd formed by patterning the third buffer layer 111c, a fourth layer 112bd formed by patterning the second gate insulating layer 112b, a fifth layer 113bd formed by patterning the second interlayer insulating layer 113b, and a sixth layer 113cd formed by patterning the third interlayer insulating layer 113c. However, the number of insulating layers constituting the plurality of first dam portions DM1 may be varied. For example, the first dam portion DM1 may include only a portion of the first layer 112ad to the sixth layer 113cd, or may further include another insulating layer, but the present disclosure is not limited thereto.

The plurality of second dam portions DM2 are disposed on some first dam portions DM1 among the plurality of first dam portions DM1. Each of the plurality of second dam portions DM2 includes a seventh layer 114bd formed by patterning the second planarization layer 114b and an eighth layer 115d formed by patterning the bank 115. The second dam portion DM2 may be disposed on the first dam portion DM1 on which the plurality of disconnection structures 150 are not formed among the plurality of first dam portions DM1. The second dam portion DM2 formed by patterning the bank 115 and the second planarization layer 114b having a relatively large thickness among the insulating layers formed on the substrate 110, may be formed to have a greater thickness to prevent the second encapsulation layer 142 from flowing toward the through hole TH. Meanwhile, FIG. 3 illustrates that six first dam portions DM1 and one second dam portion DM2 is disposed, but this is exemplarily provided, and the numbers and disposition structures of the first dam portions DM1 and the second dam portions DM2 are not limited thereto.

Referring to FIGS. 3 and 4, the plurality of disconnection structures 150 are disposed on some first dam portions DM1 among the plurality of first dam portions DM1. The disconnection structures 150 are structures for disconnecting the light emitting layer 132 and the cathode 133 of the light emitting element 130, that is, the common layer CL of the light emitting element 130. Each of the plurality of disconnection structures 150 may be disposed adjacent to an edge of an upper surface of the first dam portion DM1. For example, two disconnection structures 150 may be disposed on one first dam portion DM1, and the two disconnection structures 150 may be respectively disposed on both edges of the upper surface of the one first dam portion DM1.

The disconnection structure 150 includes a lower layer 151, an intermediate layer 152, and an upper layer 153. The lower layer 151 is disposed on the first dam portion DM1, the intermediate layer 152 is disposed on the lower layer 151, and the upper layer 153 is disposed on the intermediate layer 152. The intermediate layer 152 may have a thickness greater than that of the lower layer 151 or the upper layer 153. Among the lower layer 151, the intermediate layer 152, and the upper layer 153, the intermediate layer 152 may have a greatest thickness. The lower layer 151 and the upper layer 153 may be formed of the same material, and the intermediate layer 152 may be formed of a material different from that of the lower layer 151 and the upper layer 153. For example, the lower layer 151 and the upper layer 153 may be formed of titanium (Ti), and the intermediate layer 152 may be formed of aluminum (Al).

The lower layer 151 may be disposed on the upper surface and a side surface of the first dam portion DM1. The lower layer 151 may include a horizontal portion disposed on the upper surface of the first dam portion DM1 and a side portion disposed on the side surface of the first dam portion DM1. The lower layer 151 may include a horizontal portion disposed parallel to the upper surface of the first dam portion DM1 and a side portion disposed not parallel to the upper surface of the first dam portion DM1.

The intermediate layer 152 is disposed on the lower layer 151. The intermediate layer 152 may be disposed to overlap with the first dam portion DM1. The intermediate layer 152 may be disposed on the horizontal portion of the lower layer 151. In this case, a width of the intermediate layer 152 may be smaller than a width of the upper layer 153 and a width of the lower layer 151.

The upper layer 153 is disposed on the intermediate layer 152. The upper layer 153 may include only a horizontal portion that is horizontally disposed on the upper surface of the first dam portion DM1. The upper layer 153 has a width greater than that of the intermediate layer 152 and may protrude outwardly of the intermediate layer 152. Accordingly, the upper layer 153 and the intermediate layer 152 may form an eaves structure. As the upper layer 153 protrudes toward the trenches TR than the intermediate layer 152, the common layer CL may be more easily disconnected between the upper layer 153 and the intermediate layer 152.

Referring to FIG. 4, a distance from one edge of the upper layer 153 facing the trench TR among edges of the upper layer 153 to one side surface of the intermediate layer 152 facing the trench TR is X1, and a distance from the other edge of the upper layer 153 disposed on the first dam portion DM1 to the other side surface of the intermediate layer 152 is X2. Thus, X1 has a value greater than that of X2. Since the distance from the one edge of the upper layer 153 facing the trench TR to the one side surface of the intermediate layer 152 facing the trench TR is greater, the common layer CL may be easily disconnected between the one edge of the upper layer 153 and the intermediate layer 152.

Also, the one edge of the upper layer 153 facing the trench TR may protrude from the horizontal portion of the lower layer 151 toward the trench TR. Accordingly, a distance of X3 may be formed between the one edge of the upper layer 153 and the horizontal portion of the lower layer 151. Since the one edge of the upper layer 153 protrudes more than the horizontal portion of the lower layer 151, it is easy to disconnect the common layer CL between the upper layer 153 and the lower layer 151.

A distance between the one edge of the upper layer 153 and one edge of the lower layer 151 that face the trench TR is H1, and a distance between the other edge of the upper layer 153 and the other edge of the lower layer 151 that face away from the trench TR is H2. Thus, H1 has a value greater than that of H2. Since a thickness of the common layer CL formed on the disconnection structures 150 is limited, continuous connection of the common layer CL between the one edge of the upper layer 153 and the one edge of the lower layer 151 having the greater distance H1 may be difficult, and the common layer CL may be disconnected more easily therebetween.

Hereinafter, a method of manufacturing the display device 100 according to an exemplary aspect of the present disclosure will be described with reference to FIGS. 5A to 5F.

FIGS. 5A to 5F are process charts for explaining a method of manufacturing the display device according to an exemplary aspect of the present disclosure.

Figure 5A:
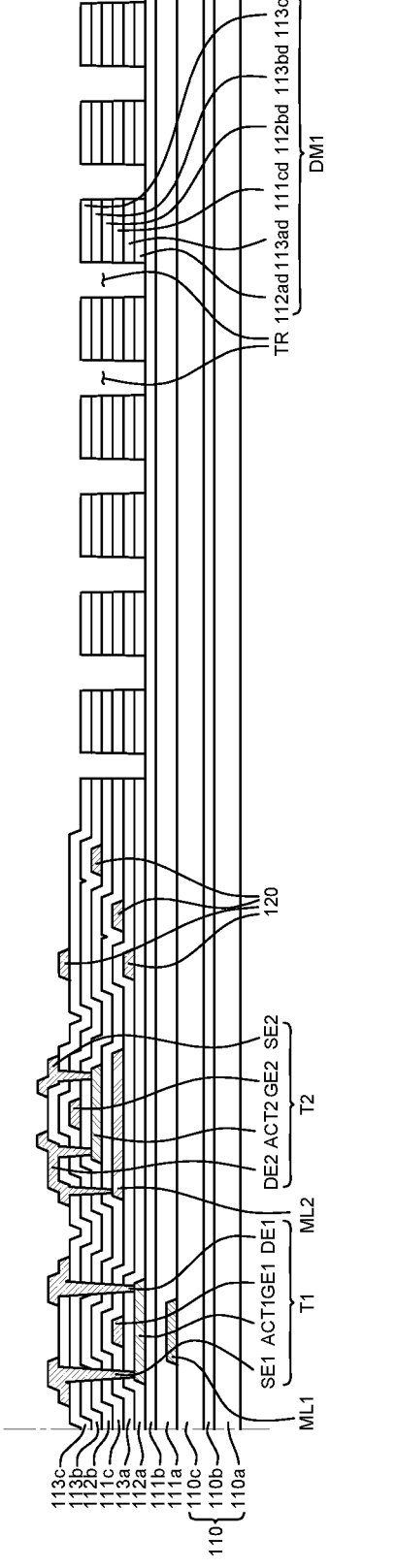
FIGS. 5A to 5F are process charts for explaining a method of manufacturing the display device according to an exemplary aspect of the present disclosure.

Referring to FIG. 5A, the first transistor T1, the second transistor T2, the first metal layer ML1, the second metal layer ML2, and the plurality of signal lines 120 are formed on the substrate 110, together with the plurality of insulating layers. The plurality of insulating layers may include a first buffer layer 111a, a second buffer layer 111b, a first gate insulating layer 112a, a first interlayer insulating layer 113a, a third buffer layer 111c, a second gate insulating layer 112b, a second interlayer insulating layer 113b, and a third interlayer insulating layer 113c.

In a process of forming the first transistor T1, the second transistor T2, the first metal layer ML1, the second metal layer ML2, and the plurality of signal lines 120 on the substrate 110, the plurality of insulating layers including the first buffer layer 111a, the second buffer layer 111b, the first gate insulating layer 112a, the first interlayer insulating layer 113a, the third buffer layer 111c, the second gate insulating layer 112b, the second interlayer insulating layer 113b, and the third interlayer insulating layer 113c may be formed together with them.

Initially, a plurality of insulating layers may be formed on the entire surface of the substrate 110. In addition, the plurality of insulating layers may be patterned to form the trenches TR, so that the plurality of first dam portions DM1 may be formed. During a process of forming contact holes for connecting the first source electrode SE1, the first drain electrode DE1, the second source electrode SE2, and the second drain electrode DE2 with the first active layer ACT1 and the second active layer ACT2, the trenches TR may be formed together with them. For example, after forming contact holes in the first gate insulating layer 112a, the first interlayer insulating layer 113a, the third buffer layer 111c, the second gate insulating layer 112b, the second interlayer insulating layer 113b, and the third interlayer insulating layer 113c, the first source electrode SE1 and the first drain electrode DE1 may be formed and electrically connected to the first active layer ACT1. When forming contact holes for connecting the first source electrode SE1 and the first drain electrode DE1 with the first active layer ACT1, the plurality of first dam portions DM1 including the first layer 112ad to the sixth layer 113cd may be formed by patterning the first gate insulating layer 112a, the first interlayer insulating layer 113a, the third buffer layer 111c, the second gate insulating layer 112b, the second interlayer insulating interlayer 113b, and the third interlayer insulating layer 113c in the disconnection area DA.

Figure 5B:
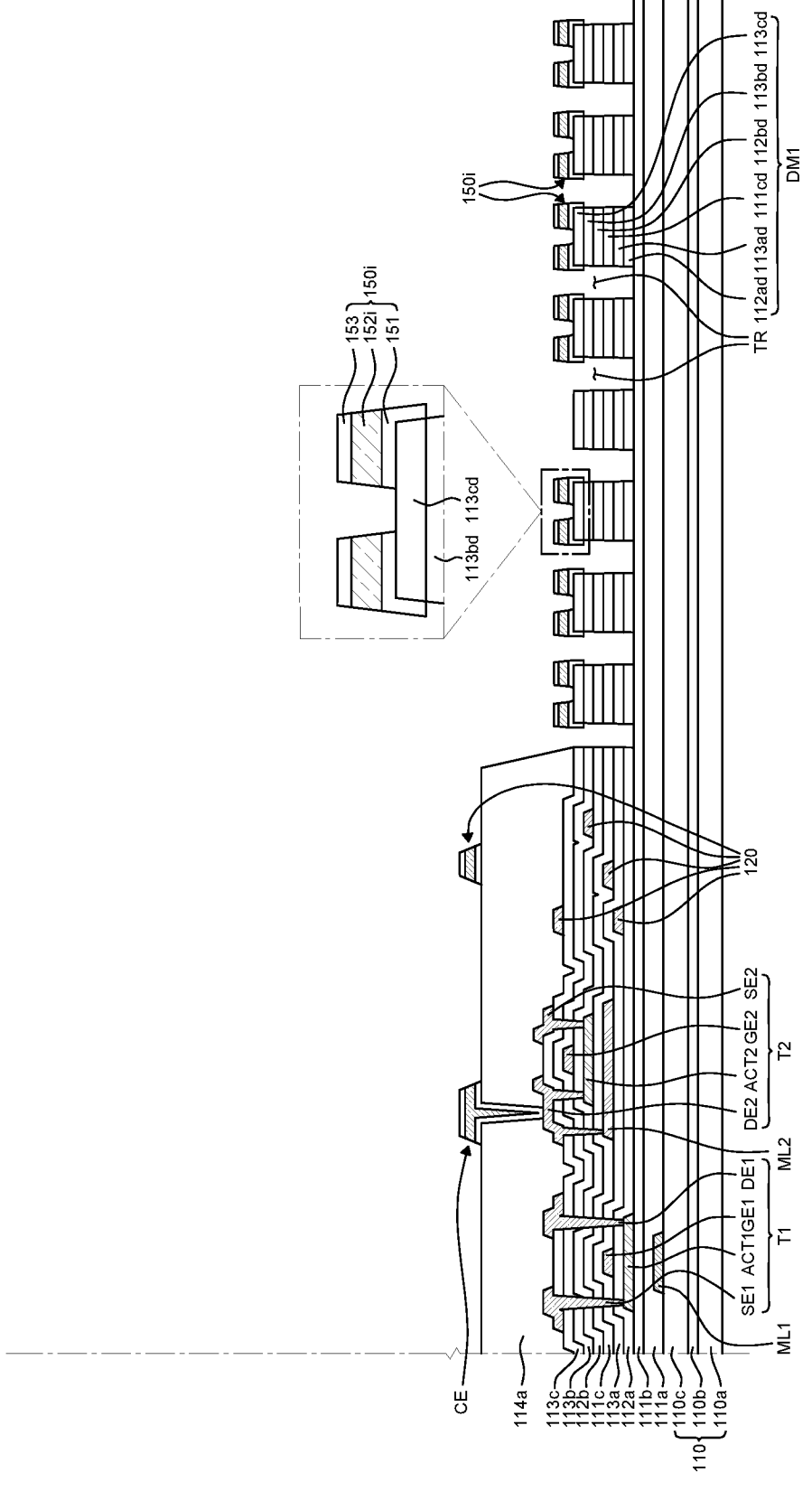

Referring to FIG. 5B, the first planarization layer 114a is formed in the active area AA on the substrate 110. Then, connection electrode CE is formed on the first planarization layer 114a in the active area AA, and initial disconnection structures 150i are formed on the first dam portions DM1 in the disconnection area DA.

The connection electrode CE and the initial disconnection structures 150i may be formed on the substrate 110 using the same material and the same process. For example, a metal layer formed of titanium (Ti), a metal layer formed of aluminum (Al), and a metal layer formed of titanium (Ti) are sequentially formed on an entire surface of the substrate 110, and they may be patterned by a dry etching method to thereby form the connection electrode CE and the initial disconnection structures 150i.

The initial disconnection structure 150*i* includes the lower layer 151, the upper layer 153, and an initial intermediate layer 152*i* between the lower layer 151 and the upper layer 153. A side surface of the initial intermediate layer 152*i* may be disposed on the same line as a side surface of the lower layer 151 and a side surface of the upper layer 153. In addition, the initial intermediate layer 152*i* may be further etched in a subsequent process and thus, may be formed as an intermediate layer 152 having a width smaller than those of the upper layer 153 and the lower layer 151 and forming the eaves structure.

In a process of forming the initial disconnection structures 150*i* and the disconnection structures 150, the lower layer 151 is bent directly along a side surface of the first dam portion DM1, but the upper layer 153 is supported by the initial intermediate layer 152*i* having a relatively great thickness, so that the horizontal portion of the upper layer 153 may have a length greater than that of the horizontal portion of the lower layer 151. Accordingly, one edge of the upper layer 153 facing the trench TR may be formed to protrude more than one edge of the lower layer 151 facing the trench TR.

Meanwhile, although not illustrated in the drawings, when the initial disconnection structure 150*i* is formed, a portion of a metal material constituting the initial disconnection structure 150*i* may remain in the trench TR without being removed to thereby form a residual layer. For example, when a depth of the trench TR is great, a residual layer may be formed within the trench TR. In this case, the metal material constituting the disconnection structure 150 may cover the trench TR to reduce penetration of moisture or oxygen through the first dam portion DM1 formed of the insulating layers.

Figure 5C:
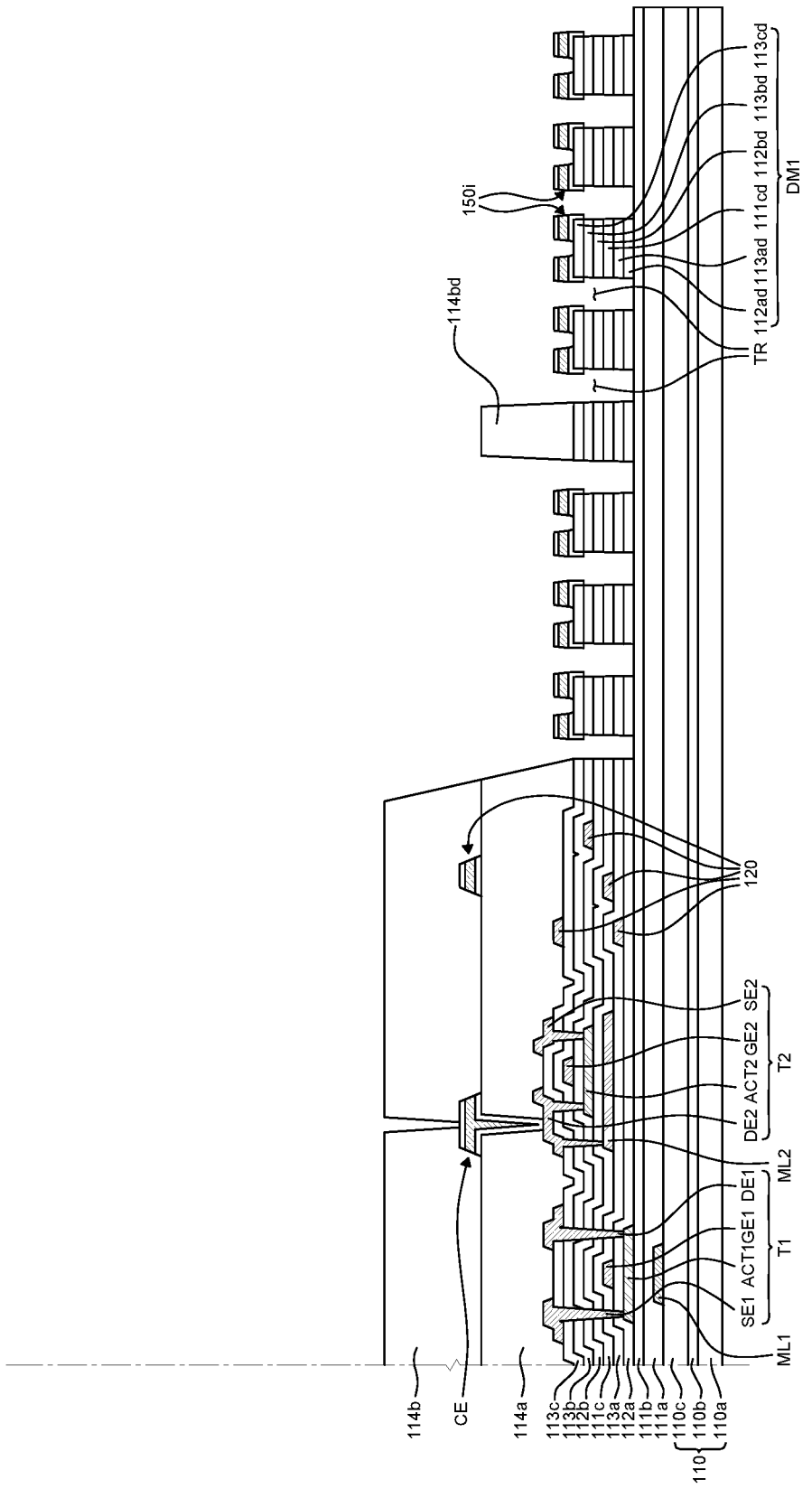

Next, referring to FIG. 5C, the second planarization layer 114*b* and the seventh layer 114*bd* of the second dam portion DM2 are formed on the substrate 110. The second planarization layer 114*b* is formed on the first planarization layer 114*a* and the connection electrode CE in the active area AA, and a material constituting the second planarization layer 114*b* is patterned while a portion thereof overlapping with the second dam portion DM2 is left in the disconnection area DA, so that the trench TR and the initial disconnection structure 150*i* may be exposed from the second planarization layer 114*b*.

Figure 5D:
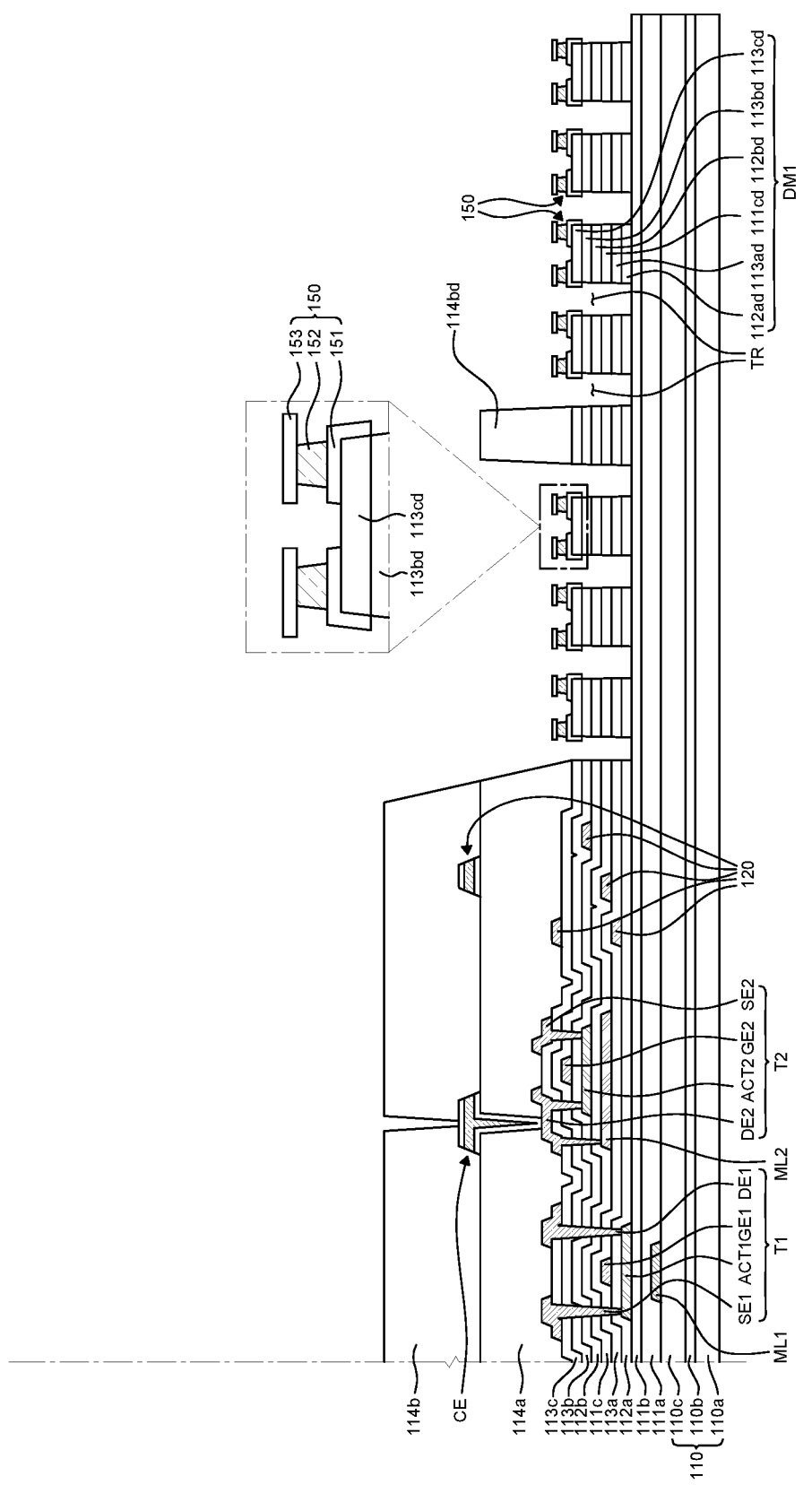

Referring to FIG. 5D, wet etching is performed on the initial disconnection structure 150*i* of the disconnection area DA exposed from the second planarization layer 114*b* to thereby form the disconnection structure 150. The initial intermediate layer 152*i* of the initial disconnection structure 150*i* may be wet-etched by performing wet etching. At this time, since the initial intermediate layer 152*i*, and the upper layer 153 and the lower layer 151 are formed of different materials, the initial intermediate layer 152*i* may be etched using an etchant capable of etching only the initial intermediate layer 152*i*. For example, since the initial intermediate layer 152*i* is formed of aluminum, and the lower layer 151 and the upper layer 153 are formed of titanium, only the initial intermediate layer 152*i* may be selectively etched using an etchant that only etches aluminum.

In this case, since only side surfaces of the initial intermediate layer 152*i* are exposed from the upper layer 153 and the lower layer 151, side portions of the initial intermediate layer 152*i* may be etched, and an etching process may be performed such that a width of the initial intermediate layer 152*i* is reduced. Accordingly, the intermediate layer 152 having a width smaller than those of the upper layer 153 and the lower layer 151 may be finally formed.

Meanwhile, in the side surfaces of the initial intermediate layer 152*i* exposed from the upper layer 153 and the lower layer 151, the side surface thereof facing the trench TR may be more etched. Since an empty space in which the trench TR is formed is greater than a space between the disconnection structures 150, a more amount of etchant may be disposed toward the trench TR, and the side surface of the initial intermediate layer 152*i* facing the trench TR may be more etched. Therefore, the distance X1 between the one edge of the upper layer 153 and the one side surface of the intermediate layer 152 that face the trench TR may be formed to be greater than the distance X2 between the other edge of the upper layer 153 and the other side surface of the intermediate layer 152 that face away from the trench TR. Therefore, the common layer CL may be more easily disconnected between the intermediate layer 152 and the one edge of the upper layer 153 facing the trench TR.

In addition, since the connection electrode CE and the signal lines 120 of the active area AA are covered by the second planarization layer 114*b*, they are not etched in a wet etching process of the initial intermediate layers 152*i* and maintain their initial state.

Figure 5E:
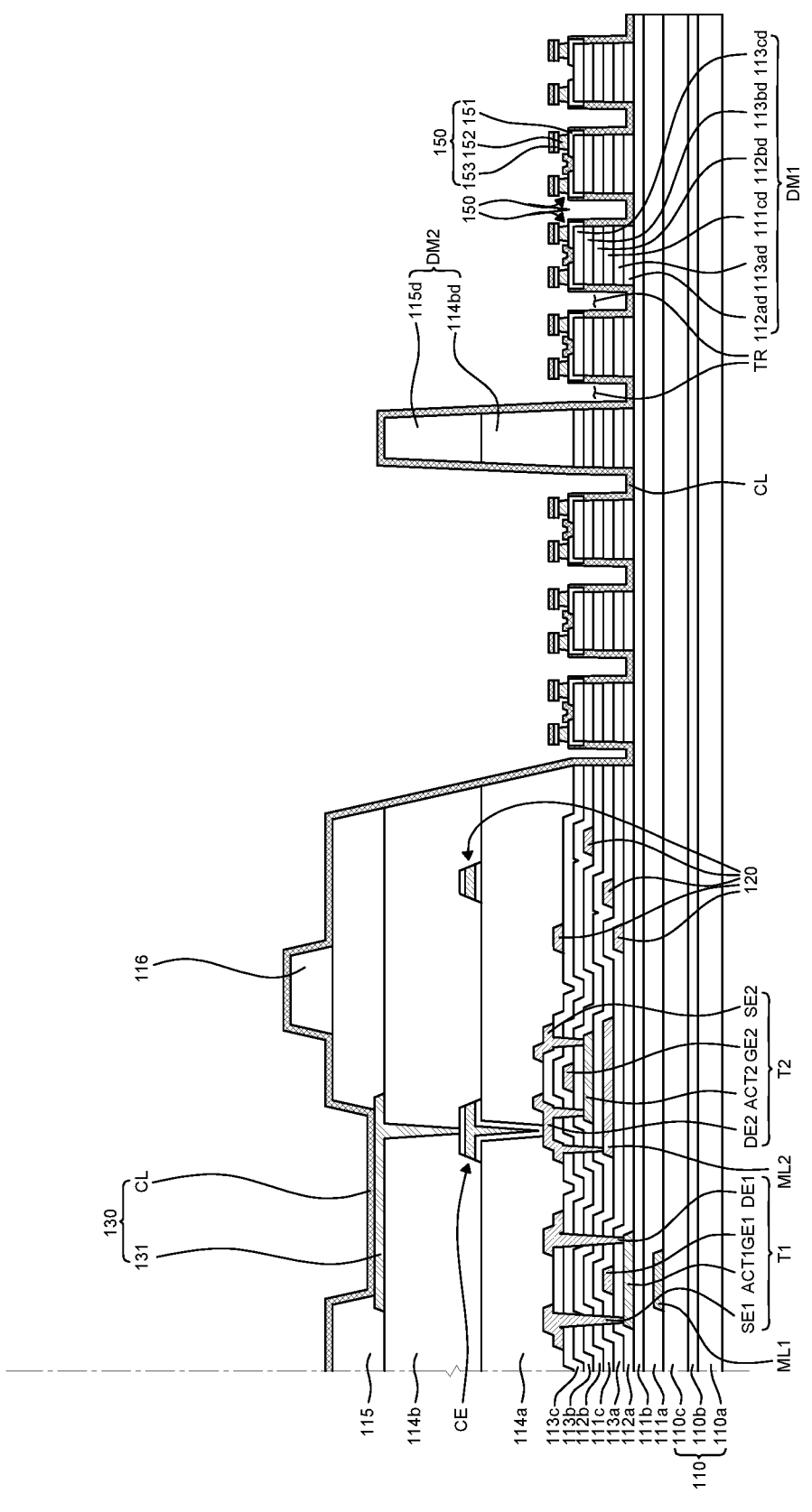

Next, referring to FIG. 5E, the anode 131 of the light emitting element 130, the bank 115, the spacer 116, and the eighth layer 115*d* of the second dam portion DM2 are formed, and the common layer CL is formed on the entire surface of the substrate 110.

Specifically, the anode 131, the bank 115, and the spacer 116 may be sequentially formed on the second planarization layer 114*b* in the active area AA. Also, when the bank 115 is formed in the disconnection area DA, the eighth layer 115*d* may be formed on the seventh layer 114*bd* of the second dam portion DM2 together with the forming of the bank 115.

In addition, the common layer CL including the light emitting layer 132 and the cathode 133 of the light emitting element 130 may be formed in an entirety of the active area AA and the disconnection area DA. The common layer CL may be evenly formed in the entirety of the active area AA, but may be disconnected by the disconnection structures 150 in the disconnection area DA.

First, a material constituting the common layer CL may generally move in a direction perpendicular to the substrate 110 and may be deposited on the substrate 110. In addition, in the disconnection structure 150, the upper layer 153 may protrude more than the intermediate layer 152 so that the upper layer 153 and the intermediate layer 152 form an eaves structure. When the material constituting the common layer CL is deposited on the disconnection structure 150, the upper layer 153 functions as a mask preventing the material constituting the common layer CL from being formed in a region below the upper layer 153, so it is difficult to form the material constituting the common layer CL in the region below the upper layer 153. Accordingly, it is difficult to form the common layer CL on the side surfaces of the intermediate layer 152 covered by the upper layer 153, and the common layer CL may be more easily disconnected between the edge of the upper layer 153 and the intermediate layer 152.

In particular, since an overall thickness of the disconnection structures 150 is greater than a thickness of the common layer CL, it is difficult for the common layer CL having a relatively small thickness to evenly cover an entirety of the disconnection structures 150 having a relatively great thickness, and the common layer CL may be disconnected between the upper layer 153 and the lower layer 151. Therefore, as the common layer CL is disconnected by the disconnection structures 150 in the disconnection area DA, it is possible to minimize penetration of moisture or oxygen in the hole area HA into the active area AA through the common layer CL.

Figure 5F:
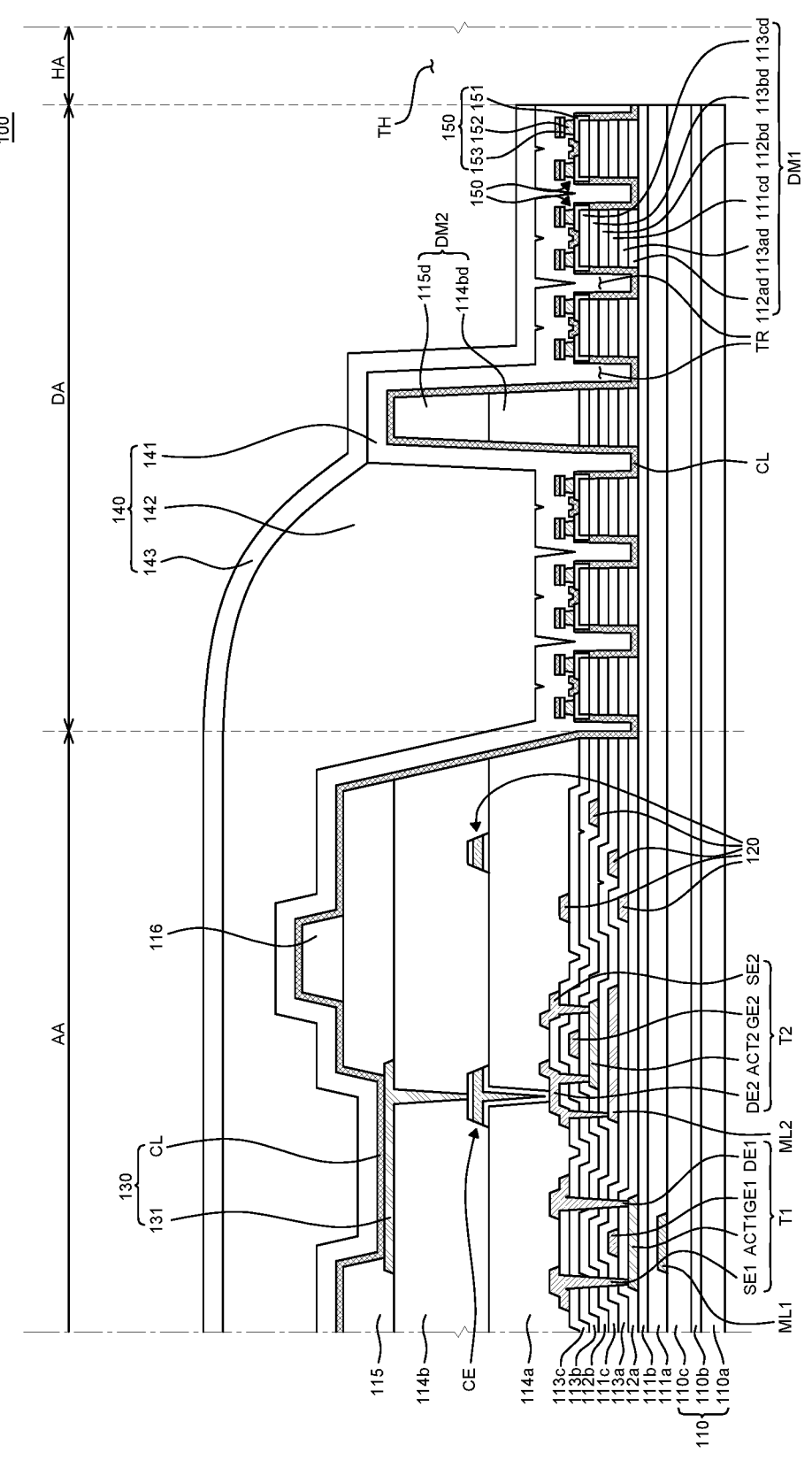

Finally, referring to FIG. 5F, the encapsulation layer 140 is formed on the common layer CL. The first encapsulation layer 141 may be formed on the common layer CL in the entirety of the active area AA and the disconnection area DA. In addition, the second encapsulation layer 142 may be formed in portions of the active area AA and the disconnection area DA. Since the second encapsulation layer 142 is prevented from flowing into the hole area HA by the second dam portion DM2, the second encapsulation layer 142 may be formed only in a space between the second dam portion DM2 and the active area AA, and may not be formed in a space between the second dam portion DM2 and the hole area HA. The active area AA may be sealed by forming the third encapsulation layer 143 covering the first encapsulation layer 141 and the second encapsulation layer 142.

Finally, the hole area HA may be formed by cutting a portion of the disconnection area DA with a laser. In this case, portions of various insulating layers formed on the substrate 110, the plurality of first dam portions DM1, and the disconnection structures 150 may be cut along with the substrate 110 and removed from the display device 100. For example, as illustrated in FIGS. 5A to 5E, during the process of manufacturing the display device 100, four first dam portions DM1 may be formed outside the second dam portion DM2. During a cutting process of the substrate 110, the first dam portion DM1 at an outermost position, the disconnection structures 150 on the first dam portion DM1 at the outermost position, and the insulating layers in upper and lower portions of the first dam portion DM1 may be removed together. Accordingly, in a final product, only three first dam portions DM1 may remain outside the second dam portion DM2. FIGS. 5E and 5F illustrate that only one first dam portion DM1 at the outermost position is removed during the cutting process, but this is exemplarily provided. The number of the first dam portions DM1 formed on the substrate 110 and the number of the disconnection structures 150 during the manufacturing process are not limited thereto. In addition, the number of the disconnection structures 150 and the number of the first dam portions DM1 removed in the cutting process are not limited thereto. In addition, the number of the first dam portions DM1 and the number of the disconnection structures 150 that remain in the display device 100 after the cutting process may be designed variously according to time required for moisture permeability reliability of the display device 100 or a bezel size or the like of the display device 100.

Meanwhile, the display device 100 is cut in the hole area HA, and edges of the substrate 110 and the various insulating layers on the substrate 110 may be exposed to the outside at a boundary between the hole area HA and the disconnection area DA. That is, the edges of the substrate 110 and the insulating layers facing the hole area HA may be exposed from the encapsulation layer 140, and moisture or oxygen may penetrate from the edges that are exposed from the encapsulation layer 140. However, in the display device according to an exemplary aspect of the present disclosure, even though some components of the display device 100 are exposed from the encapsulation layer 140 in the hole area HA, since the plurality of disconnection structures 150, the plurality of first dam portions DM1, and the plurality of second dam portions DM2 are disposed between the active area AA and the hole area HA, penetration of moisture or oxygen may be minimized.

Therefore, in the display device 100 according to an exemplary aspect of the present disclosure, the common layer CL may be disconnected by forming the plurality of disconnection structures 150 in the disconnection area DA. The disconnection structure 150 may form an eaves structure in which the upper layer 153 protrudes more than the intermediate layer 152, and the common layer CL may be easily disconnected in this eaves structure. Also, since the disconnection structure 150 is formed to have a thickness greater than that of the common layer CL, it is difficult to form the common layer CL continuously in an entirety of the disconnection structure 150. In addition, as the disconnection structures 150 are formed on the edges of the first dam portion DM1, the distance between the edge of the upper layer 153 and the edge of the lower layer 151 that face the trench TR may be increased, and the common layer CL may be disconnected more easily. Therefore, in the display device 100 according to an exemplary aspect of the present disclosure, the common layer CL is disconnected by the disconnection structures 150 having the eaves structure so that it is possible to block penetration of moisture or oxygen in the hole area HA into the active area AA, and reliability of the display device 100 may be improved.

Figure 6:
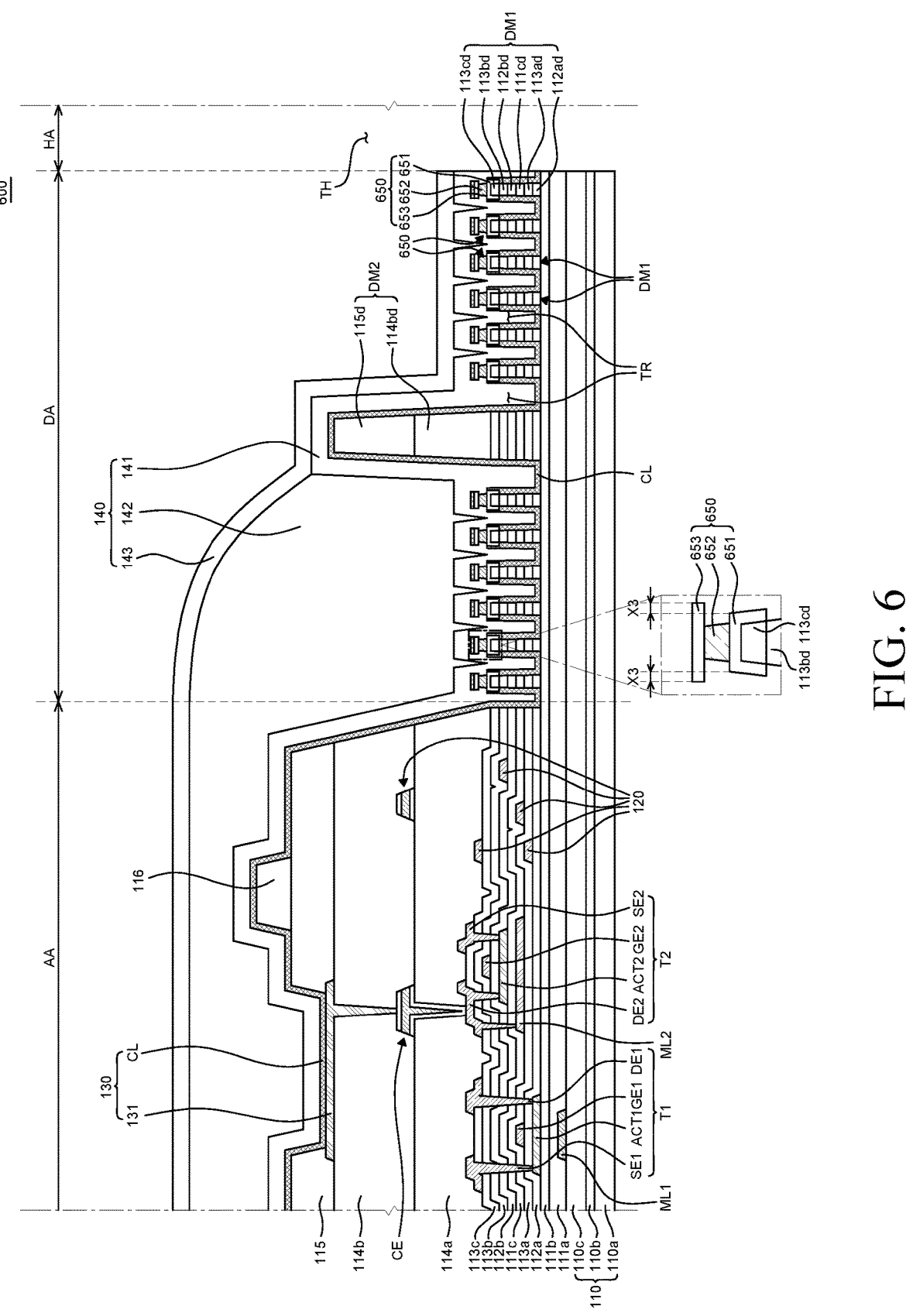
FIG. 6 is a cross-sectional view of a display device according to another exemplary aspect of the present disclosure.

FIG. 6 is a cross-sectional view of a display device according to another exemplary aspect of the present disclosure. Other configurations of a display device 600 of FIG. 6 are substantially identical to those of the display device 100 of FIGS. 1 to 4 except for a plurality of disconnection structures 650 and first dam portions DM1, and redundant descriptions thereof will be omitted.

Referring to FIG. 6, one disconnection structure 650 is disposed on one first dam portion DM1. Each of the plurality of disconnection structures 650 may be disposed in a one-to-one correspondence with each of the plurality of first dam portions DM1. A lower layer 651 of the disconnection structure 650 may be formed to cover the upper surface of the first dam portion DM1 and both side surfaces of the first dam portion DM1. As one disconnection structure 650 is disposed between a pair of trenches TR, both edges of an upper layer 653 may be formed to protrude more than a horizontal portion of the lower layer 651. Accordingly, the common layer CL may be easily disconnected at both edges of the disconnection structure 650.

Therefore, in the display device 600 according to another exemplary aspect of the present disclosure, one disconnection structure 650 is formed on one first dam portion DM1, so that areas where the common layer CL may be disconnected may increase. One disconnection structure 650 may be disposed between a pair of trenches TR. Since edges of the upper layer 653 facing the trenches TR are formed to protrude more than the horizontal portion of the lower layer 651, it is difficult for the common layer CL to be deposited on the horizontal portion of the lower layer 651 and side surfaces of the intermediate layer 652, so that the common layer CL may be disconnected. Therefore, the areas where the common layer CL may be disconnected may increase in that both sides of one disconnection structure 650 face the trenches TR, and thus, a penetration path of moisture and oxygen through the common layer CL may be easily blocked.

The exemplary aspects of the present disclosure may also be described as follows:

According to an aspect of the present disclosure, there is provided a display device. The display device includes a substrate including an active area, a hole area disposed within the active area and having a through hole disposed therein, and a disconnection area surrounding the hole area, and a plurality of disconnection structures disposed on the substrate in the disconnection area. Each of the plurality of disconnection structures includes, a lower layer, an intermediate layer disposed on the lower layer and having a width smaller than that of the lower layer, and an upper layer disposed on the intermediate layer and having a width greater than that of the intermediate layer.

The lower layer and the upper layer may be formed of the same material, and the intermediate layer may be formed of a material different from that of the lower layer and the upper layer.

The lower layer and the upper layer may be formed of titanium, and the intermediate layer may be formed of aluminum.

A thickness of the intermediate layer may be greater than a thickness of the lower layer and a thickness of the upper layer.

The display device may further include a plurality of light emitting elements disposed on the substrate. The plurality of light emitting elements may include a plurality of anodes disposed in the active area, and a common layer disposed on the plurality of anodes in the active area and disposed on the plurality of disconnection structures in the disconnection area. At least portions of the common layer in the disconnection area may be disconnected by the plurality of disconnection structures.

The common layer may include a light emitting layer disposed on the plurality of anodes in the active area and disposed on the plurality of disconnection structures in the disconnection area, and a cathode disposed on the light emitting layer in the active area and the disconnection area.

The display device may further include a plurality of first dam portions disposed in the disconnection area and spaced apart from each other to form trenches therebetween. The plurality of disconnection structures may be disposed on at least some first dam portions among the plurality of first dam portions.

The lower layer of each of the plurality of disconnection structures may cover an upper surface and a side surface of each of the plurality of first dam portions.

The lower layer may include a horizontal portion disposed parallel to the upper surface of each of the plurality of first dam portions and a side portion disposed on the side surface of each of the plurality of first dam portions, and the upper layer may include a horizontal portion disposed parallel to the upper surface of each of the plurality of first dam portions, and the horizontal portion of the upper layer may protrude toward the trenches than the horizontal portion of the lower layer.

Each of the plurality of disconnection structures may be disposed adjacent to both edges of each of the plurality of first dam portions.

In each of a pair of disconnection structures disposed on one of the first dam portions among the plurality of disconnection structures, a distance between one edge of the upper layer and one side surface of the intermediate layer that face the trench may be greater than a distance between the other edge of the upper layer and the other side surface of the intermediate layer.

A distance between the one edge of the upper layer and one edge of the lower layer may be greater than a distance between the other edge of the upper layer and the other edge of the lower layer.

Each of the plurality of disconnection structures may be disposed in a one-to-one correspondence with each of the plurality of first dam portions.

Both edges of the lower layer of each of the plurality of disconnection structures may be disposed on side surfaces of the plurality of respective first dam portions.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device, comprising:
a substrate including an active area, a hole area disposed within the active area and having a through hole disposed in the hole area, and a disconnection area surrounding the hole area;
a plurality of first dam portions disposed in the disconnection area and spaced apart from each other and forming trenches among the plurality of first dam portions; and
a plurality of disconnection structures disposed on at least some first dam portions among the plurality of first dam portions,
wherein:
each of the plurality of disconnection structures includes:
a lower layer;
an intermediate layer disposed on the lower layer and having a width smaller than that of the lower layer; and
an upper layer disposed on the intermediate layer and having a width greater than that of the intermediate layer; and
the lower layer of each of the plurality of disconnection structures covers an upper surface and a side surface of each of the at least some first dam portions.

2. The display device of claim 1, wherein the lower layer and the upper layer are formed of a same material, and wherein the intermediate layer is formed of a material different from that of the lower layer and the upper layer.

3. The display device of claim 2, wherein the lower layer and the upper layer are formed of titanium, and the intermediate layer is formed of aluminum.

4. The display device of claim 1, wherein a thickness of the intermediate layer is greater than a thickness of the lower layer and a thickness of the upper layer.

5. The display device of claim 1, further comprising:
a plurality of light emitting elements disposed on the substrate,
wherein the plurality of light emitting elements include,
a plurality of anodes disposed in the active area; and
a common layer disposed on the plurality of anodes in the active area and disposed on the plurality of disconnection structures in the disconnection area,

wherein at least portions of the common layer in the disconnection area are disconnected by the plurality of disconnection structures.

6. The display device of claim 5, wherein the common layer includes:

a light emitting layer disposed on the plurality of anodes in the active area and disposed on the plurality of disconnection structures in the disconnection area; and a cathode disposed on the light emitting layer in the active area and the disconnection area.

7. The display device of claim 5, further comprising:

an encapsulation layer comprising a first encapsulation layer that is an inorganic layer and disposed on the common layer, a second encapsulation layer that is an organic layer and disposed on the first encapsulation layer, and a third encapsulation layer that is an inorganic layer and disposed on the second encapsulation layer; and a plurality of second dam portions disposed on the first dam portions on which the disconnection structures are not disposed among the plurality of first dam portions, wherein a thickness of the second dam portion is formed to prevent the second encapsulation layer from flowing toward the through hole.

8. The display device of claim 1, wherein:

the lower layer includes:

a horizontal portion disposed parallel to the upper surface of each of the at least some first dam portions; and a side portion disposed on the side surface of each of the at least some first dam portions;

the upper layer includes a horizontal portion disposed parallel to the upper surface of each of the plurality of first dam portions; and the horizontal portion of the upper layer protrudes toward the trenches than the horizontal portion of the lower layer.

9. The display device of claim 8, wherein each of the plurality of disconnection structures is disposed adjacent to at least one edges of each of the at least some first dam portions.

10. The display device of claim 9, wherein:

a pair of the disconnection structures are disposed on one of the first dam portions; and in each of the pair of the disconnection structures, a distance between one edge of the upper layer and one side surface of the intermediate layer that face the trench is greater than a distance between the other edge of the upper layer and the other side surface of the intermediate layer that face away from the trench.

11. The display device of claim 10, wherein a distance between the one edge of the upper layer and one edge of the lower layer that face the trench is greater than a distance between the other edge of the upper layer and the other edge of the lower layer that face away from the trench.

12. The display device of claim 8, wherein each of the plurality of disconnection structures is disposed in a one-to-one correspondence with each of the at least some first dam portions.

13. The display device of claim 12, wherein both edges of the lower layer of each of the plurality of disconnection structures are disposed on both side surfaces of the corresponding first dam portion, respectively.

* * * * *